United States Patent
Quinn et al.

(10) Patent No.: US 11,117,151 B2
(45) Date of Patent: Sep. 14, 2021

(54) FIXTURE ASSEMBLY FOR COATING COMBUSTOR PANELS

(71) Applicant: United Technologies Corporation, Farmington, CT (US)

(72) Inventors: Timothy William Quinn, New Windsor, NY (US); Scott A. Elliott, Rock Hill, NY (US)

(73) Assignee: Raytheon Technologies Corporation, Farmington, CT (US)

( * ) Notice: Subject to any disclaimer, the term of this patent is extended or adjusted under 35 U.S.C. 154(b) by 188 days.

(21) Appl. No.: 15/998,735

(22) Filed: Aug. 16, 2018

(65) Prior Publication Data

US 2019/0060939 A1 Feb. 28, 2019

Related U.S. Application Data

(60) Provisional application No. 62/549,195, filed on Aug. 23, 2017.

(51) Int. Cl.
*B05B 13/02* (2006.01)
*B05C 13/02* (2006.01)
(Continued)

(52) U.S. Cl.
CPC .......... *B05B 13/0292* (2013.01); *B05C 13/02* (2013.01); *C23C 14/042* (2013.01); *C23C 14/30* (2013.01); *C23C 14/505* (2013.01); *F01D 5/288* (2013.01); *F01D 25/285* (2013.01); *F23R 2900/00018* (2013.01)

(58) Field of Classification Search
CPC ......... B25B 11/00; B25B 11/02; B65G 49/07; G11B 5/084; B05B 13/0285; B05B 13/0292; B05B 13/02; C23C 14/042; C23C 14/30; C23C 14/50; C23C 14/505; C23C 14/56; C23C 4/02; F01D 25/285; F01D 25/288; F23R 2900/00018
USPC ............ 118/500, 503, 728, 729; 204/298.15; 269/63, 88, 900, 43, 309
See application file for complete search history.

(56) References Cited

U.S. PATENT DOCUMENTS 4,074,897 A * 2/1978 Behn ....................... B25B 5/147
269/43
4,271,005 A * 6/1981 Wright .................... C23C 14/50
118/728

(Continued)

FOREIGN PATENT DOCUMENTS

JP 09157844 A 6/1997
WO 2014138416 A1 9/2014

OTHER PUBLICATIONS

European search report for patent application No. 18190509.2-1103 dated Jan. 29, 2019.

*Primary Examiner* — Joseph J Hail
*Assistant Examiner* — Arman Milanian
(74) *Attorney, Agent, or Firm* — Bachman & LaPointe, PC

(57) ABSTRACT

A fixture assembly for supporting workpieces in a coating process includes a shaft; and a plurality of fixtures each having a workpiece support surface and a shaft mount defining a shaft mounting structure, wherein the shaft mounting structure extends from the workpiece support surface such that, when the shaft mounting structure is engaged with the shaft, workpiece support surfaces of the fixtures are positioned facing radially outwardly away from the shaft.

14 Claims, 7 Drawing Sheets

(51) Int. Cl.
*C23C 14/04* (2006.01)
*C23C 14/30* (2006.01)
*C23C 14/50* (2006.01)
*F01D 5/28* (2006.01)
*F01D 25/28* (2006.01)

(56) References Cited

U.S. PATENT DOCUMENTS

| | | | | |
|---|---|---|---|---|
| 5,133,643 | A * | 7/1992 | Ortolano | F01D 5/225 269/43 |
| 5,259,603 | A * | 11/1993 | Geisler | B65G 49/061 269/152 |
| 5,562,277 | A * | 10/1996 | Swann | B25B 1/22 269/43 |
| 5,803,971 | A * | 9/1998 | Menchetti | B05C 13/02 118/500 |
| 5,849,359 | A * | 12/1998 | Burns | C23C 14/505 427/242 |
| 5,997,947 | A * | 12/1999 | Burns | C23C 14/505 118/500 |
| 6,309,607 | B1 * | 10/2001 | Johnston | G01N 1/312 118/423 |
| 6,887,529 | B2 * | 5/2005 | Borneman | C23C 4/02 118/503 |
| 7,837,843 | B2 * | 11/2010 | Sharp | C23C 14/505 204/298.15 |
| 8,323,409 | B2 | 12/2012 | Schlichting et al. | |
| 8,562,744 | B2 * | 10/2013 | Wu | B05B 13/0242 118/719 |
| 10,151,245 | B2 * | 12/2018 | Strock | F01D 25/285 |
| 2009/0056630 | A1 * | 3/2009 | Hester | C23C 16/458 118/730 |
| 2009/0324852 | A1 * | 12/2009 | Schlichting | C23C 14/505 427/596 |
| 2010/0213053 | A1 * | 8/2010 | Wang | C23C 14/505 204/298.12 |
| 2011/0247558 | A1 * | 10/2011 | Pei | C23C 14/50 118/723 R |
| 2012/0061894 | A1 * | 3/2012 | Cahill | B25B 11/02 269/37 |
| 2012/0222957 | A1 * | 9/2012 | Wu | C23C 14/35 204/298.28 |
| 2013/0149450 | A1 * | 6/2013 | Feuerstein | B05C 13/02 427/282 |
| 2013/0177707 | A1 * | 7/2013 | Feuerstein | C23C 14/505 427/282 |
| 2013/0221589 | A1 * | 8/2013 | Mandler | B23Q 3/088 269/21 |
| 2014/0173896 | A1 * | 6/2014 | Tryon | B05C 13/02 29/888.012 |
| 2016/0010197 | A1 * | 1/2016 | Strock | C23C 4/11 427/259 |

* cited by examiner

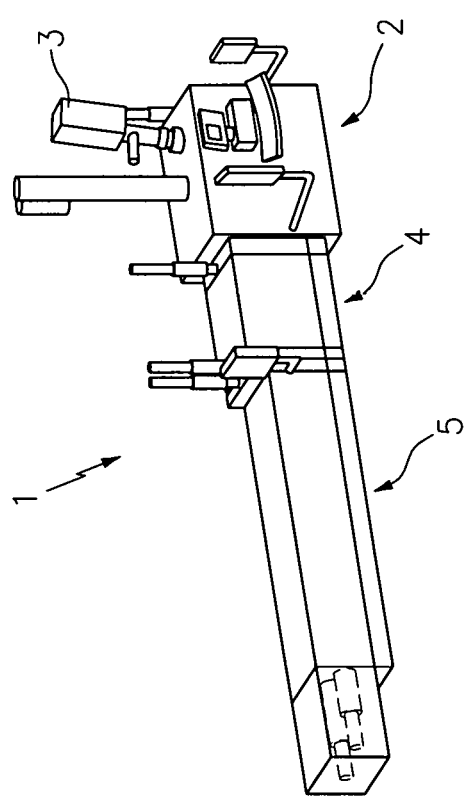
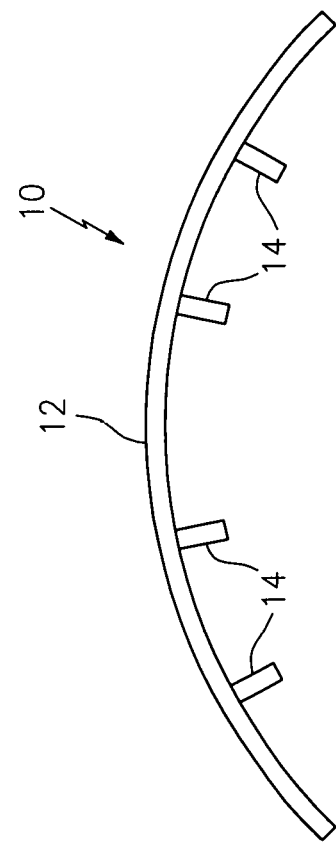
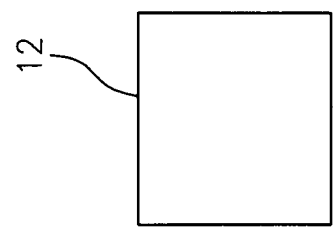

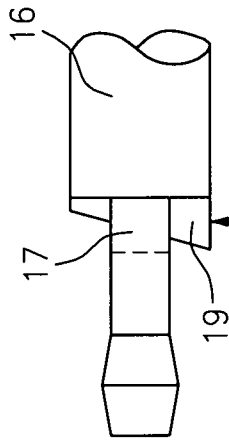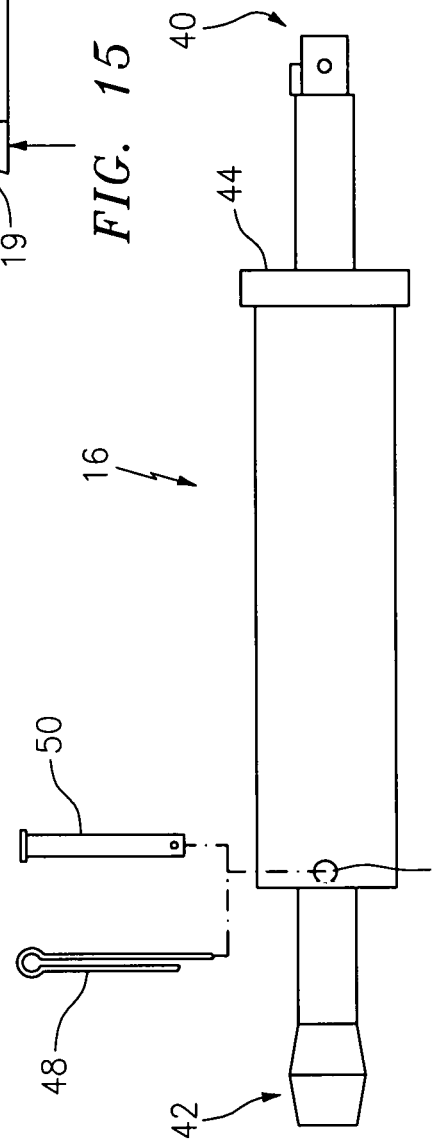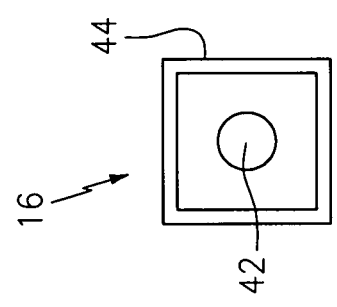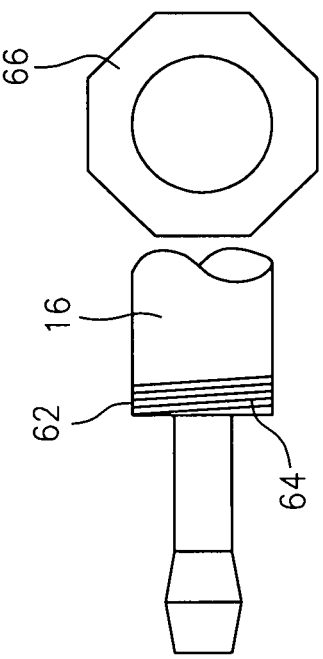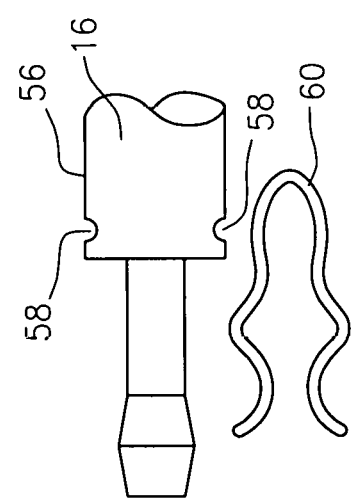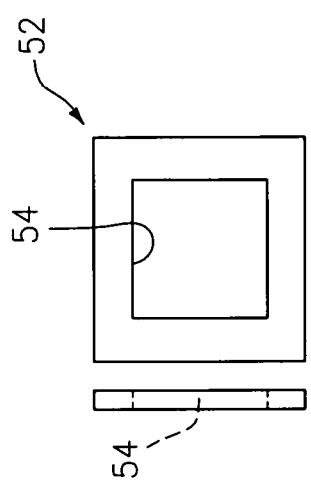

FIXTURE ASSEMBLY FOR COATING COMBUSTOR PANELS

BACKGROUND

The present disclosure relates to coating processes such as electron beam physical vapor deposition (EBPVD) coating, and more particularly to a fixture for workpieces in such a process.

In EBPVD processes, workpieces are positioned in a closed chamber and an electron beam is impinged upon a source of material which is to be vaporized and then deposited upon the workpiece. Such a process is well known for use in coating various workpieces such as components of gas turbine engines and the like.

EBPVD coating systems include expensive equipment and there is an ever present need to increase efficiency and production from such systems. The present disclosure is directed to this need.

SUMMARY OF THE INVENTION

In one non-limiting configuration, a fixture assembly for supporting workpieces in a coating process, comprises a shaft; and a plurality of fixtures each having a workpiece support surface and a shaft mount defining a shaft mounting structure, wherein the shaft mounting structure extends from the workpiece support surface such that, when the shaft mounting structure is engaged with the shaft, workpiece support surfaces of the fixtures are positioned facing radially outwardly away from the shaft.

In another non-limiting configuration, the shaft has a longitudinal axis, and workpiece support surfaces are positioned in pairs which are aligned with each other along the longitudinal axis.

In another non-limiting configuration, the pairs of workpiece support surfaces are positioned radially equidistant around the longitudinal axis.

In another non-limiting configuration, the plurality of fixtures are engaged with the shaft in a stack along the shaft such that pairs of workpiece support surfaces are defined along the shaft and facing oppositely away from the shaft.

In a further non-limiting configuration, spacers are positioned between the fixtures to maintain spacing between the fixtures such that a consistent spacing is provided between edges of axially adjacent workpiece support surfaces.

In another non-limiting configuration, the workpiece support surface and the shaft mounting structure each have an axial dimension with respect to the shaft, the axial dimension of the workpiece support surface is greater than the axial dimension of the shaft mounting structure, and the shaft mounting structure is axially offset from an axial center of the workpiece support surface such that a pair of fixtures can be positioned on the shaft with the workpiece support surfaces axially aligned along the shaft.

In a further non-limiting configuration, the shaft mounting structure has opposed axially oriented faces, and one of the axially oriented faces is aligned with an axial center of the workpiece support surface whereby the plurality of fixtures have the same structure.

In another non-limiting configuration, the fixture assembly further includes an end flange at one end of the shaft, and fixture securing structure at the other end of the shaft such that the plurality of fixtures can be positioned over the shaft and secured between the end flange and the fixture securing structure.

In a further non-limiting configuration, the workpiece support surface is a substantially outwardly convex surface curved around a center axis which is parallel to the longitudinal axis of the shaft.

In another non-limiting configuration, the fixture assembly includes mounting structures for securing a workpiece to the workpiece support surface.

In a further non-limiting configuration, the mounting structures can be holes for receiving studs on the workpiece.

In yet another non-limiting configuration, the shaft has a polygonal shape, and the shaft engagement structure defines an opening matching the polygonal shape so that the fixtures can be axially positioned along the shaft and secured against rotation relative to the shaft.

In an additional non-limiting configuration, the shaft and the shaft engagement structure define a keyed structure whereby the fixtures can be axially positioned along the shaft and secured against rotation relative to the shaft.

In a further non-limiting configuration, the workpiece support surface has a long dimension and a short dimension, and the short dimension is aligned with the longitudinal axis of the shaft.

In a still further non-limiting configuration, the workpiece support surface has a long dimension and a short dimension, and the long dimension is aligned with the longitudinal axis of the shaft.

BRIEF DESCRIPTION OF THE DRAWINGS

A detailed description follows, with reference to the attached drawings, wherein:

FIG. 1 schematically illustrates an EBPVD system;

FIG. 2 illustrates a combustor panel which is a typical workpiece for use with the subject matter of the present disclosure;

FIG. 3 shows an end view of a combustor panel as shown in FIG. 2;

FIGS. 10 and 11 illustrate a shaft according to one non-limiting embodiment of the disclosure;

FIG. 12 illustrates a retaining plate according to a non-limiting embodiment of the disclosure;

FIGS. 13, 14 and 15 illustrate non-limiting alternative embodiments for securing fixtures on a shaft;

DETAILED DESCRIPTION

Figure 4:
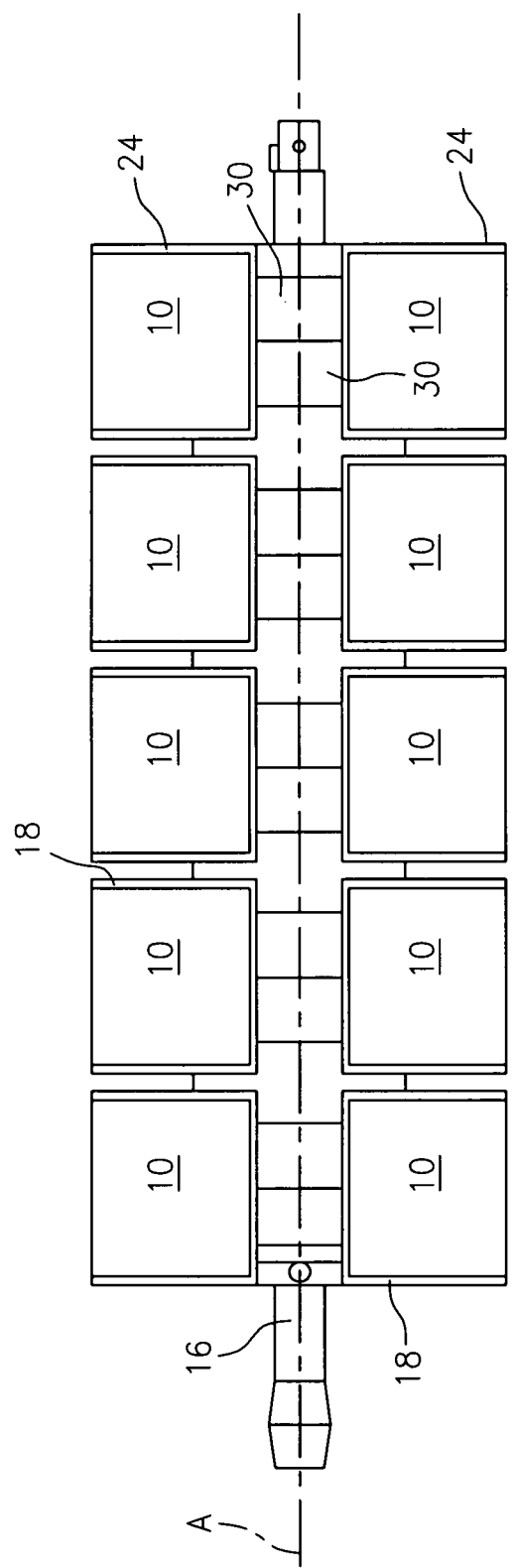
FIG. 4 schematically illustrates a fixture assembly having pairs of oppositely facing workpiece support surfaces.

Referring to FIG. 1, a coating machine in the form of an EBPVD coating machine 1 is illustrated. In such a machine, a coating chamber 2 has an electron beam gun 3 which directs an electron beam at an ingot or other source of material which is to be vaporized within chamber 2 and then coated onto parts placed in the chamber. A heating chamber 4 is typically provided to heat parts in advance of positioning them in chamber 2 for coating. A loading station 5 can be provided to hold parts waiting to be treated in heating chamber 4 and then coating chamber 2. The system illustrated in FIG. 1 shows a single station 5 and single electron beam gun 3. In other configurations, multiple stations and heating chambers can be arranged to feed parts to a single coating chamber, and multiple EB guns can be provided for the chamber. The present disclosure is well suited to any such configuration, as well as to other types of coating systems.

Various different types of parts can be coated using such a system. FIG. 2 shows a combustor panel 10 which is one of numerous components which can usefully be coated, for example with suitable material for a thermal barrier coating. Non-limiting examples of typical coating materials used in an EBPVD process include metallic coatings for corrosion resistance and ceramic coatings (yttria stabilized zirconia ("YSZ") or gadolinia stabilized zirconia ("GSZ")) for thermal insulation. These coatings are typically used on high temperature gas turbine components such as blades, vanes, and liner segments or panels. Combustor panels 10 can be convex, concave or flat. Panels 10 are typically coated only on one side. FIG. 2 shows a panel 10 which has a convex outward surface 12 which is to be coated. Panel 10 also typically has structure to be used in securing in place when assembled into a combustor assembly, and these structures are shown in FIG. 2 as studs 14. FIG. 3 shows a simple end view of panel 10 of FIG. 2, and illustrates a simple flat profile to the convex curved surface. Other configurations are possible, and well within the broad scope of the disclosure.

FIGS. 4-9 collectively illustrate a fixture assembly for use in supporting workpieces such as combustor panel 10 for treatment in a coating process such as an EBPVD coating process in a coating machine such as that illustrated in FIG. 1. FIG. 4 shows a shaft 16 on which are positioned fixtures 18 each supporting a panel 10. In this non-limiting embodiment, panels are supported in spaced pairs along a longitudinal axis A of shaft 16. This configuration helps to provide efficient use of capacity of a coating machine and is particularly well suited to coating workpieces which are to be coated only on one side.

Figure 5:
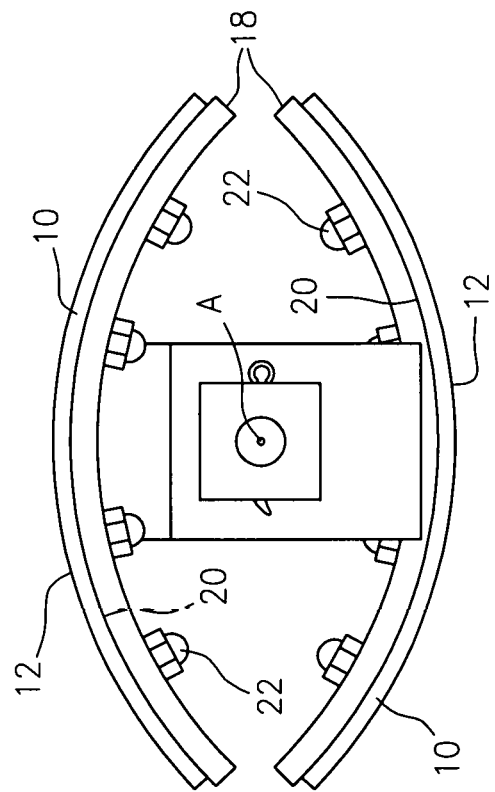
FIG. 5 schematically illustrates an end view of the assembly of FIG. 4.
Figure 8:
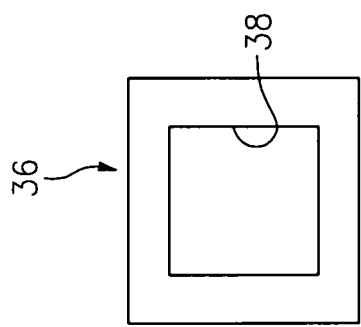
FIGS. 8 and 9 illustrate a spacing member according to one non-limiting embodiment of the disclosure.
Figure 9:
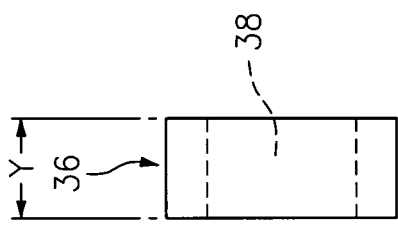

FIG. 5 shows an end view of the fixture assembly of FIG. 4, and further illustrate panels 10 mounted on fixtures 18, in this case such that panels 10 are positioned to have inner concave surfaces 20 curved around a central axis (not shown) which would be substantially parallel to axis A. FIG. 5 also shows nuts 22 which can be secured to studs 14 of panels 10 to hold panels 10 in place on fixtures 18.

Figure 6:
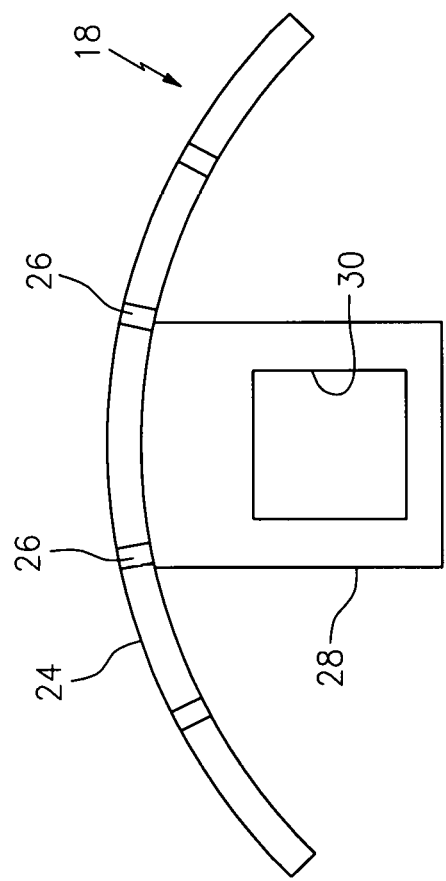
FIGS. 6 and 7 illustrate a fixture according to one non-limiting embodiment of the disclosure.
Figure 7:
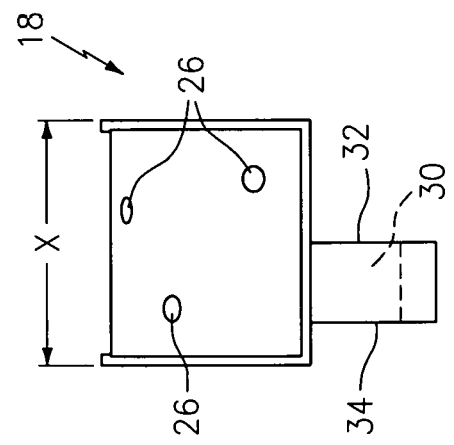

FIGS. 6 and 7 further illustrate a non-limiting embodiment of fixture 18. As shown fixture 18 can have a workpiece support surface 24 which can be shaped to match the shape of a workpiece to be mounted, in this case a combustor panel 10. Thus, in the illustrated embodiment, workpiece support surface 24 has a radially outwardly convex surface. Holes 26 can be provided on surface 24 to receive studs 14 of panels 10 for securing panels 10 to surface 24 as desired.

Fixtures 18 also have a shaft mount 28 which defines a shaft mounting structure, which in this case is the square opening 30 defined in shaft mount 28. Opening 30 has a shape which is configured to match the shape of shaft 16, such that fixtures 18 can be axially positioned along shaft 16, but are secured against rotation relative to shaft 16. In the illustrated and non-limiting embodiment, shaft 16 and opening 30 are square in shape.

FIG. 7 illustrates the positioning of shaft mount 28 relative to workpiece support surface 24. Workpiece support surface 24 has a dimension X which is to be aligned with parallel to the axis A of shaft 16. In order to mount fixtures 18 on shaft 16 with pairs of axially aligned support surfaces 24 as shown in FIG. 4, shaft mount 28 is not centered along dimension X, but rather is offset such that one face 32 is substantially centered along dimension X, while the opposed face 34 is spaced away from face 32 and the center of dimension X. This offset positioning of shaft mount 28 relative to support surface 24 allows for a single shape fixture 18 to be alternated in position to result in the assembly as shown in FIG. 4, with faces 32 of adjacent fixtures 18 facing toward each other at substantially the center point of dimension X.

In order to provide proper spacing of fixtures 18 along shaft 16, spacers 36 (FIGS. 8 and 9) can be provided and positioned between faces 34 of adjacent fixtures 18. Spacers 36 can be a simple structure having an opening 38 configured to match the outer shape of shaft 16, and having a dimension Y which is oriented along axis A of shaft 16 when mounted on shaft 16. Dimension Y is configured to provide a small gap between edges of adjacent pairs of support surfaces 24 (and panels 10 mounted therein), again as is illustrated in FIG. 4.

FIGS. 10 and 11 illustrate a non-limiting configuration of a shaft 16, which in this case has a square outer shape. Shaft 16 has two ends 40, 42 which are configured to be mounted within a support structure of machine 1, for example in a rake structure which can be moved within a coating chamber to provide proper coating of all aspects of a workpiece mounted to shaft 16. Rotation of shaft 16 around longitudinal axis A can be desired, for example to sequentially position panels 10 facing toward a source of vapor in the coating chamber. In one non-limiting configuration, end 40 of shaft 16 can have structure to engage in a drive for producing this rotation, while end 42 can have a structure configured for free rotation in the support structure.

Shaft 16 can have a flange 44 defined at one end, and flange 44 serves to hold fixtures 18 and spacers 36 in place against movement off shaft 16 in the direction of end 40.

Shaft 16 also can be provided with a fastener structure to hold fixtures 18 and spacers 36 on shaft 16 against movement off shaft in the direction of end 42. FIG. 10 shows this structure in the form of a hole or passage 46 in shaft 16, and a cotter pin 48 or clevis pin 50 which can be positioned in hole 46. In this way, a series or stack of fixtures 18 can be secured on shaft 16 between flange 44 and pin 48, 50.

If flange 44 is not sufficient to secure fixtures 18 and spacers 36 in place, an additional flange 52 can be provided for mounting on shaft 16, see FIG. 12. Flange 52 can have an opening 54 sized to match the outer shape of shaft 16. Flange 52 is configured to extend radially from shaft 16 a sufficient distance to securely hold fixtures 18 in place on shaft 16.

FIGS. 13 and 14 show alternative non-limiting examples of other structures for securing fixtures 18 in place on shaft 16. As shown in FIG. 13, an outer surface 56 of shaft 16 can be provided with notches 58, and an external clip 60 can be provided for securing within notches 58. FIG. 14 shows an end portion 62 of shaft 16 with threads 64, and shows a nut 66 which could be threadedly engaged with threads 64 on end portion 62 to hold fixtures 18 and spacers 36 in position along shaft 16. FIG. 15 shows a further non-limiting alternative for securing fixtures 18 and spacers 36 on shaft 16. Shaft 16 can be provided with a slot 17, and a wedge 19 can be provided which is sized to position within slot 17 and compress and hold fixtures and spacers in place on shaft 16.

It should be appreciated that the non-limiting embodiment of a fixture assembly as illustrated in FIGS. 4-15 can be used to securely position a plurality of panels 10 along a shaft 16 such that the panels are held in pairs positioned radially outwardly from the shaft, with panels of each pair aligned with each other along the axis A of the shaft.

Figure 16:
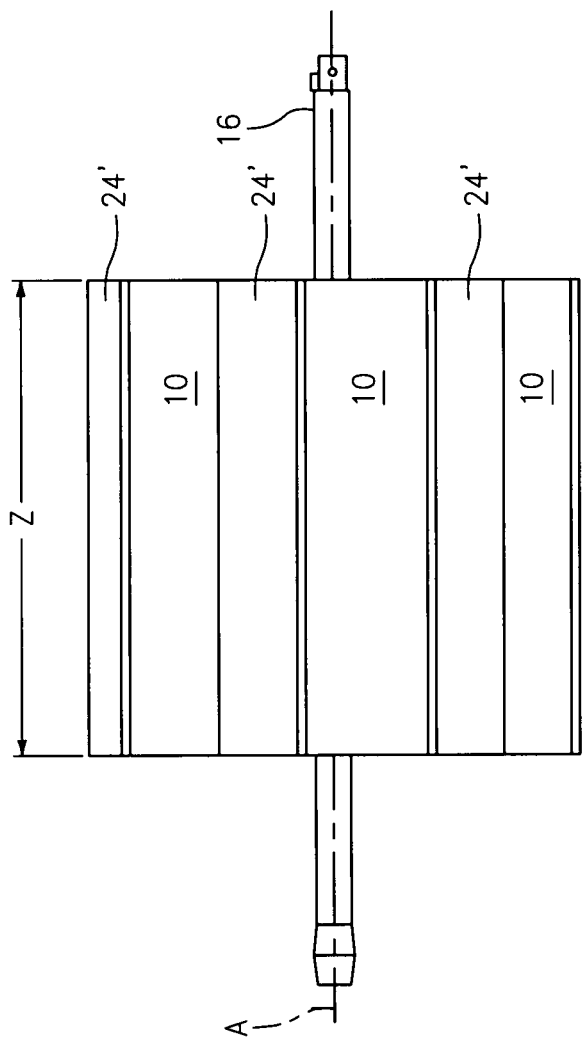
FIG. 16 illustrates a non-limiting alternative embodiment mounting panels parallel to a longitudinal axis of the shaft.
Figure 17:
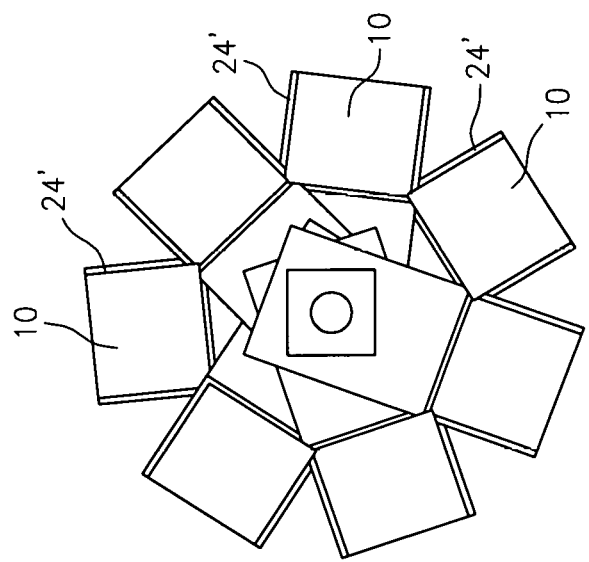
FIG. 17 is an end view of the illustration of FIG. 15.
Figure 18:
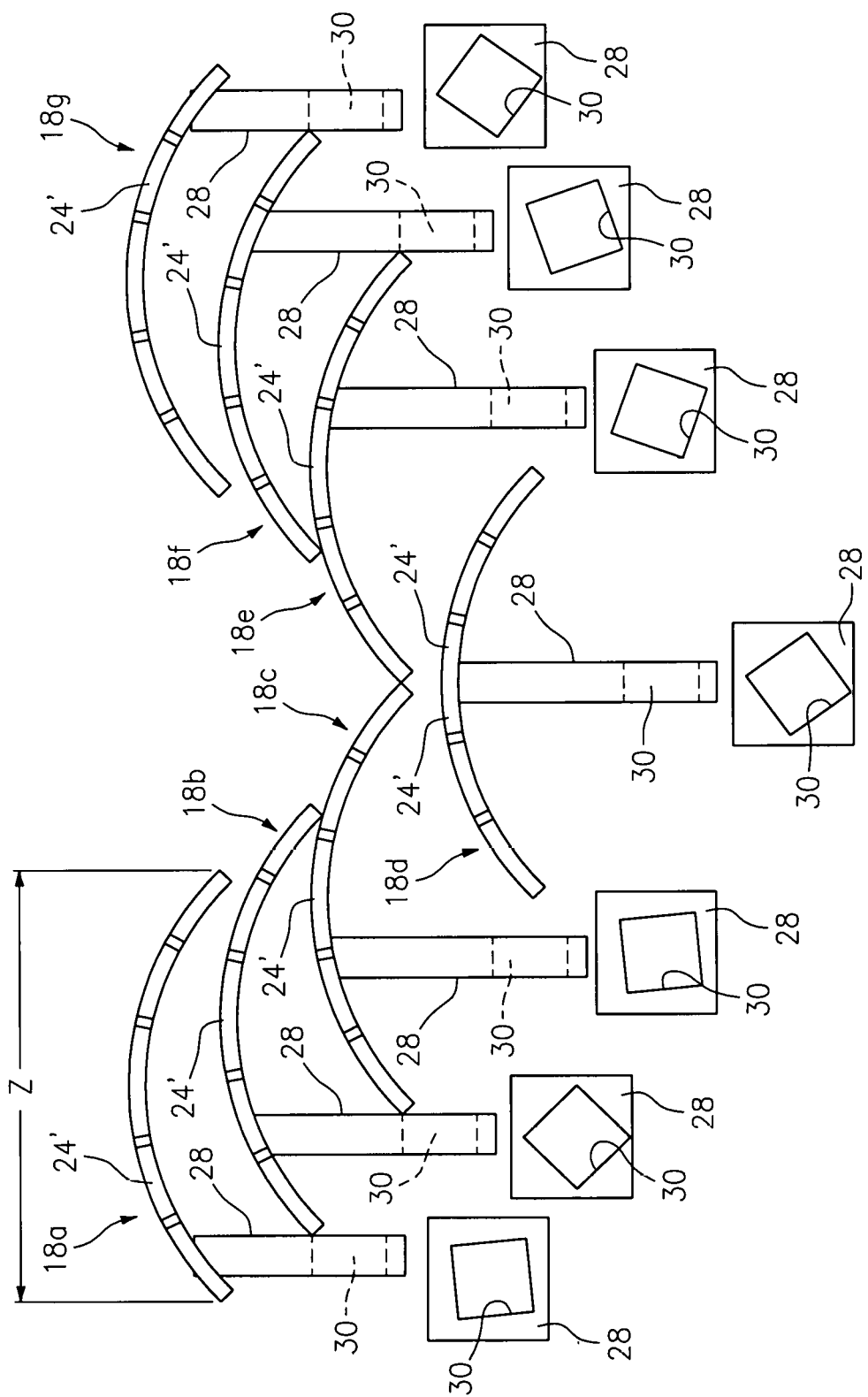
FIG. 18 illustrates an array of separate fixtures for the configuration of FIG. 15.

FIGS. 16-18 illustrate a different and non-limiting embodiment wherein panels are supported with a long dimension Z of the panel substantially parallel with axis A of the shaft. Similarly to the positioning described above, panels are arranged along shaft in a group of panels which are axially aligned with each other along axis A. In this non-limiting embodiment, a total of seven (7) support surfaces 24' are aligned in such fashion. This positioning of support surfaces and panels mounted thereto is well suited to providing substantially uniform coating of the panel or other workpiece as the rotational and oscillation of the shaft does not need to take different axial positions of the workpiece into account and can therefore be simpler than would otherwise be the case.

FIG. 17 shows an end view of this configuration, and shows how the seven (7) support surfaces 24' and panels 10 mounted thereon extend radially away from shaft 16 and are substantially equally spaced around shaft 16.

With reference to FIG. 18, an array of different fixtures 18a-g are illustrated, and this combination of fixtures would have different configuration of shaft mount 28 such that support surfaces 24' of the group of seven (7) fixtures 18 can be aligned with each other along shaft 16. FIG. 18 shows a different position and length of each shaft mount 28. Further, the orientation of the shaft engagement opening 30 would be different for each shaft mount 28, and thus a representation of the different rotational orientation of opening 30 is included in FIG. 18 beneath each different fixture 18a-18g. In this more complex configuration, shaft mounts 28 are provided in different locations along dimension Z such that shaft mounts 28 of the plurality of fixtures 18a-18g are serially stacked along shaft 16 with support surfaces 24' axially aligned with each other relative to shaft 16 as shown in FIG. 16.

It should be appreciated that other different numbers of fixtures 18 are contemplated and well within the scope of this disclosure, and could be selected based upon the size of the coating chamber and other openings and chambers through which the fixture assembly with workpieces must pass during use. For example, a fixture assembly could be provided defining 3, 4, 5, 6, 8 or more radially distributed and axially aligned workpiece support surfaces, as non-limiting additional examples of alternative configurations.

Figure 19:
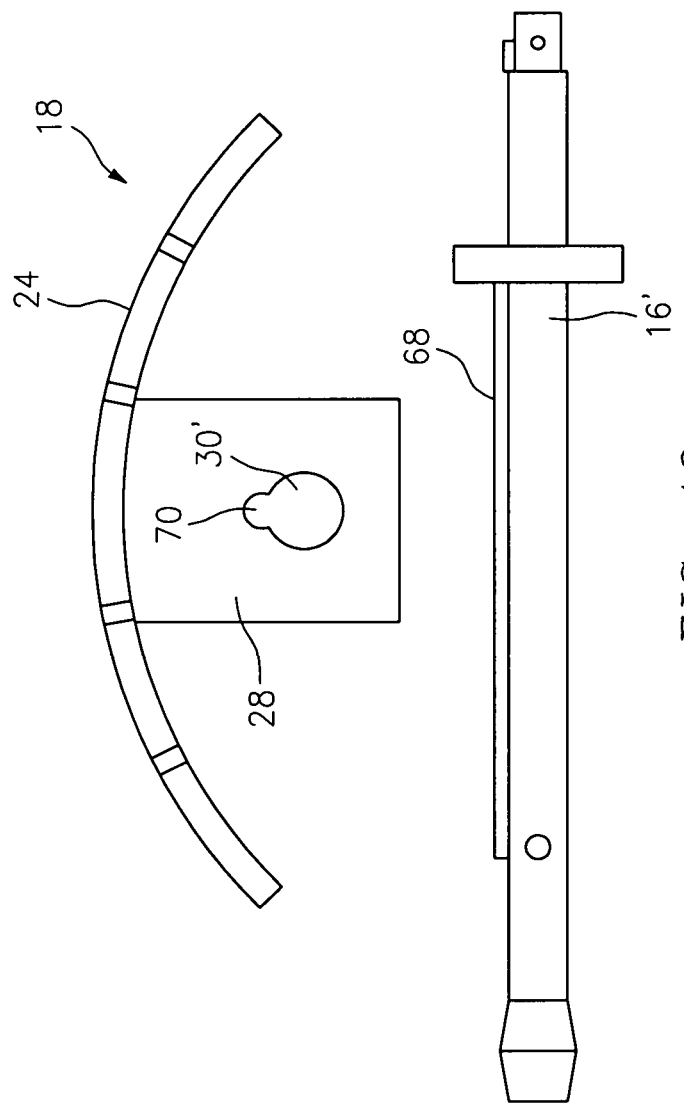
FIG. 19 illustrates a non-limiting alternative configuration having a keyed shaft.

As set forth above, the shape of shaft 16 and corresponding openings 30 can be square as shown in the figures described above, or could be any other polygonal or otherwise interlocking shape so long as fixtures 18 can be axially positioned along shaft 16, and are fixed against rotation relative to shaft 16. FIG. 19 shows an additional non-limiting embodiment wherein a keyed shaft 16' having one or more ridges is paired with shaft mounts 28 having a notched opening 30' having one or more corresponding grooves 70. When fixture 18 of this configuration is mounted on shaft 16', ridge 68 engages in groove 70 and holds shaft mount 28 and fixture 18 against rotation relative to shaft 16'.

The fixture assembly disclosed herein advantageously allows for workpieces such as combustor panels to be positioned in an efficient manner for coating in a coating machine such as an EBPVD coating machine. It should be appreciated that other embodiments and configurations would be understood to a person skilled in the art upon consideration of the non-limiting embodiments disclosed herein, and all such alternative configurations are considered to be within the broad scope of the present disclosure.

We claim:

1. A fixture assembly for supporting workpieces in a coating process, comprising:
   a shaft; and
   a plurality of fixtures each having a workpiece support surface and a shaft mount defining a shaft mounting structure, wherein the shaft mounting structure extends from the workpiece support surface such that, when the shaft mounting structure is engaged with the shaft, workpiece support surfaces of the fixtures are positioned facing radially outwardly away from the shaft, wherein the workpiece support surface is a substantially outwardly convex surface curved around a center axis which is parallel to the longitudinal axis of the shaft.

2. The fixture assembly of claim 1, wherein the shaft has a longitudinal axis, and wherein workpiece support surfaces are positioned in pairs which are aligned with each other along the longitudinal axis.

3. The fixture assembly of claim 2, wherein the pairs are positioned radially equidistant around the longitudinal axis.

4. The fixture assembly of claim 1, wherein the plurality of fixtures are engaged with the shaft in a stack along the shaft such that pairs of workpiece support surfaces are defined along the shaft and facing oppositely away from the shaft.

5. The fixture assembly of claim 4, further comprising spacers positioned between the fixtures to maintain spacing between the fixtures such that a consistent spacing is provided between edges of axially adjacent workpiece support surfaces.

6. The fixture assembly of claim 1, wherein the workpiece support surface and the shaft mounting structure each have an axial dimension with respect to the shaft, wherein the axial dimension of the workpiece support surface is greater than the axial dimension of the shaft mounting structure, and wherein the shaft mounting structure is axially offset from an axial center of the workpiece support surface such that a pair of fixtures can be positioned on the shaft with the workpiece support surfaces axially aligned along the shaft.

7. The fixture assembly of claim 6, wherein the shaft mounting structure has opposed axially oriented faces, and wherein one of the axially oriented faces is aligned with an axial center of the workpiece support surface whereby the plurality of fixtures have the same structure.

8. The fixture assembly of claim 1, further comprising an end flange at one end of the shaft, and fixture securing structure at the other end of the shaft such that the plurality of fixtures can be positioned over the shaft and secured between the end flange and the fixture securing structure.

9. The fixture assembly of claim 1, further comprising mounting structures for securing a workpiece to the workpiece support surface.

10. The fixture assembly of claim 9, wherein the mounting structures comprise holes for receiving studs on the workpiece.

11. The fixture assembly of claim 1, wherein the shaft has a polygonal shape, and wherein the shaft engagement structure defines an opening matching the polygonal shape so that the fixtures can be axially positioned along the shaft and secured against rotation relative to the shaft.

12. The fixture assembly of claim 1, wherein the shaft and the shaft engagement structure define a keyed structure whereby the fixtures can be axially positioned along the shaft and secured against rotation relative to the shaft.

13. The fixture assembly of claim 1, wherein the workpiece support surface has a long dimension and a short dimension, and wherein the short dimension is aligned with the longitudinal axis of the shaft.

14. The fixture assembly of claim 1, wherein the workpiece support surface has a long dimension and a short dimension, and wherein the long dimension is aligned with the longitudinal axis of the shaft.

* * * * *